(12) United States Patent
Robinson et al.

(10) Patent No.: US 7,132,035 B2
(45) Date of Patent: Nov. 7, 2006

(54) METHODS, APPARATUSES, AND SUBSTRATE ASSEMBLY STRUCTURES FOR FABRICATING MICROELECTRONIC COMPONENTS USING MECHANICAL AND CHEMICAL-MECHANICAL PLANARIZATION PROCESSES

(75) Inventors: Karl M. Robinson, Boise, ID (US); Pai-Hung Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/789,359

(22) Filed: Feb. 20, 2001

(65) Prior Publication Data
US 2001/0009811 A1    Jul. 26, 2001

Related U.S. Application Data

(62) Division of application No. 09/146,949, filed on Sep. 3, 1998, now Pat. No. 6,191,037.

(51) Int. Cl.
*C23F 1/00* (2006.01)
*B24B 49/00* (2006.01)

(52) U.S. Cl. ............... 156/345.12; 156/345.13; 451/5; 451/66

(58) Field of Classification Search .......... 156/345.12, 156/345.13; 451/57, 66, 5, 41; 216/88, 216/89, 84
See application file for complete search history.

(56) References Cited

U.S. PATENT DOCUMENTS

| | | | |
|---|---|---|---|
| 4,879,258 A | 11/1989 | Fisher | 437/225 |
| 5,036,015 A | 7/1991 | Sandhu et al. | 437/8 |
| 5,069,002 A * | 12/1991 | Sandhu et al. | 451/1 |
| 5,308,438 A | 5/1994 | Cote et al. | 156/636 |
| 5,597,442 A * | 1/1997 | Chen et al. | 156/626.1 |
| 5,643,046 A | 7/1997 | Katakabe et al. | 451/6 |
| 5,643,050 A * | 7/1997 | Chen | 451/10 |

(Continued)

FOREIGN PATENT DOCUMENTS

JP    06-252112    *    9/1994

(Continued)

OTHER PUBLICATIONS

"End Point Detector for Chemi-Mechanical Polisher," IBM Technical Disclosure Bulletin, vol. 31, No. 4, Sep. 1988.

(Continued)

*Primary Examiner*—George A. Goudreau
(74) *Attorney, Agent, or Firm*—Dorsey & Whitney LLP

(57) ABSTRACT

Methods, apparatuses and substrate assembly structures for mechanical and chemical-mechanical planarizing processes used in the manufacturing microelectronic-device substrate assemblies. One aspect of the invention is directed toward a method for planarizing a microelectronic-device substrate assembly by removing material from a surface of the substrate assembly, detecting a first change in drag force between the substrate assembly and a polishing pad indicating that the substrate surface is planar, and identifying a second change in drag force between the substrate assembly and the polishing pad indicating that the planar substrate surface is at the endpoint elevation. After the second change in drag force is identified, the planarization process is stopped. The first change in drag force between the substrate assembly and the planarizing medium is preferably detected by measuring a first change in the electrical current through a drive motor driving a substrate holder carrying the substrate assembly and/or a table carrying the polishing pad. The second change in drag force between the substrate assembly and the polishing pad may be identified by detecting a second change in the drive motor current or measuring a second change in the temperature of the planarizing solution or the polishing pad.

15 Claims, 7 Drawing Sheets

U.S. PATENT DOCUMENTS

| | | | | |
|---|---|---|---|---|
| 5,647,952 | A | | 7/1997 | Chen .................. 156/636.1 |
| 5,652,177 | A | | 7/1997 | Pan ........................ 437/69 |
| 5,722,875 | A | * | 3/1998 | Iwashita et al. ............ 451/8 |
| 5,738,562 | A | | 4/1998 | Doan et al. ................ 451/5 |
| 5,817,572 | A | | 10/1998 | Chiang et al. ............ 438/624 |
| 5,830,041 | A | * | 11/1998 | Takahashi et al. .......... 451/8 |
| 5,846,882 | A | | 12/1998 | Birang .................... 438/692 |
| 5,882,244 | A | * | 3/1999 | Hiyama et al. ............ 451/7 |
| 5,981,353 | A | | 11/1999 | Tsai ...................... 438/424 |
| 5,981,354 | A | | 11/1999 | Spikes et al. ............ 438/424 |
| 6,007,408 | A | * | 12/1999 | Sandhu .................... 451/41 |
| 6,046,111 | A | * | 4/2000 | Robinson .................. 438/693 |
| 6,066,550 | A | | 5/2000 | Wang ...................... 438/586 |
| 6,077,783 | A | * | 6/2000 | Allman et al. ............ 438/691 |
| 6,080,670 | A | | 6/2000 | Miller et al. ............ 438/691 |
| 6,146,973 | A | * | 11/2000 | He et al. ................ 438/433 |
| 6,150,072 | A | | 11/2000 | Shoda et al. ............ 430/313 |
| 6,191,037 | B1 | | 2/2001 | Robinson et al. .......... 438/690 |
| 6,241,847 | B1 | * | 6/2001 | Allman et al. .......... 156/636.1 |
| 6,352,466 | B1 | * | 3/2002 | Moore ...................... 451/5 |

FOREIGN PATENT DOCUMENTS

| | | | |
|---|---|---|---|
| JP | 07-297193 | * | 11/1995 |
| JP | 09-262743 | * | 10/1997 |
| JP | 10-202522 | * | 8/1998 |
| JP | 10-202523 | * | 8/1998 |

OTHER PUBLICATIONS

"Model 6DQ Servo Controlled Polisher," R. Howard Strasbaugh, Inc., Huntington Beach, CA, p. 8, Apr. 1987.

* cited by examiner

METHODS, APPARATUSES, AND SUBSTRATE ASSEMBLY STRUCTURES FOR FABRICATING MICROELECTRONIC COMPONENTS USING MECHANICAL AND CHEMICAL-MECHANICAL PLANARIZATION PROCESSES

CROSS-REFERENCE TO RELATED APPLICATION

This application is a divisional of U.S. patent application Ser. No. 09/146,949, filed Sep. 3, 1998 now U.S. Pat. No. 6,191,037.

TECHNICAL FIELD

The present invention relates to fabricating components of microelectronic devices using mechanical and/or chemical-mechanical planarizing processes. More specifically, the present invention relates to methods, apparatuses and substrate assembly structures for identifying the endpoint in mechanical and/or chemical-mechanical planarization of microelectronic substrate assemblies.

BACKGROUND OF THE INVENTION

Mechanical and chemical-mechanical planarizing processes (collectively "CMP") are used in the manufacturing of microelectronic devices for forming a flat surface on semiconductor wafers, field emission displays and many other microelectronic substrates. FIG. 1 schematically illustrates a planarizing machine 10 with a platen or table 20, a carrier assembly 30 over the table 20, a polishing pad 40 on the table 20, and a planarizing fluid 44 on the polishing pad 40. The planarizing machine 10 may also have an under-pad 25 between the platen 20 and the polishing pad 40. In many planarizing machines, a drive assembly 26 rotates (arrow A) and/or reciprocates (arrow B) the platen 20 to move the polishing pad 40 during planarization.

The carrier assembly 30 controls and protects a substrate 12 during planarization. The carrier assembly 30 typically has a substrate holder 32 that holds the substrate 12 via suction, and a pad 34 in the substrate holder 32 that supports the backside of the substrate 12. A drive assembly 36 of the carrier assembly 30 typically rotates and/or translates the substrate holder 32 (arrows $C_1$ and D, respectively). The substrate holder 32, however, may be a weighted, free-floating disk (not shown) that slides over the polishing pad 40.

The combination of the polishing pad 40 and the planarizing fluid 44 generally define a planarizing medium that mechanically and/or chemically-mechanically removes material from the surface of the substrate 12. The polishing pad 40 can be a conventional non-abrasive polishing pad without abrasive particles composed of a polymeric material (e.g., polyurethane), or it can be an abrasive polishing pad with abrasive particles fixedly bonded to a suspension material. In a typical application, the planarizing fluid 44 may be a CMP slurry with abrasive particles and chemicals for use with a conventional nonabrasive polishing pad. In other applications for use with an abrasive polishing pad, the planarizing fluid 44 is generally a "clean" chemical solution without abrasive particles.

To planarize the substrate 12 with the planarizing machine 10, the carrier assembly 30 presses the substrate 12 against a planarizing surface 42 of the polishing pad 40 in the presence of the planarizing fluid 44 (arrow $C_2$). The platen 20 and/or the substrate holder 32 then move relative to one another to translate the substrate 12 across the planarizing surface 42. As a result, the abrasive particles and/or the chemicals in the planarizing medium remove material from the surface of the substrate 12.

CMP processes should consistently and accurately produce a uniformly planar surface on the substrate assembly to enable precise fabrication of circuits and photo-patterns. During the fabrication of transistors, contacts, interconnects, and other components, many substrate assemblies develop large "step heights" that create a highly topographic substrate surface. To enable the fabrication of integrated circuits with high densities of components, it is necessary to produce a planar substrate surface at several stages of processing the substrate assembly because non-planar substrate surfaces significantly increase the difficulty of forming sub-micron features or photo-patterns to within a tolerance of approximately 0.1 μm. Thus, CMP processes should typically transform a highly topographical substrate surface into a highly uniform, planar substrate surface (e.g., a "blanket surface").

In the competitive semiconductor industry, it is also highly desirable to maximize the yield of operable devices as quickly as possible. One factor of CMP processing that affects the yield of operable devices is the ability to accurately stop CMP processing at a desired endpoint. In a typical CMP process, the desired endpoint is reached when the surface of the substrate is highly planar and/or when enough material has been removed from the substrate assembly to form discrete components of the integrated circuits (e.g., shallow-trench-isolation structures, contacts, damascene lines, etc.). Accurately endpointing CMP processing is important for maintaining a high yield because: (1) subsequent processing may not be possible if the surface is not sufficiently planar; and/or (2) the integrated circuits may not operate if the discrete components are not accurately formed. For example, if the substrate is "under-planarized," shallow-trench-isolation structures may not be adequately isolated from one another. Conversely, if the substrate assembly is "over-polished," "dishing" can occur in shallow-trench-isolation structures that can cause current-leakage paths or parasitic capacitance. Extreme cases of over-polishing can even destroy sections of the substrate assembly. Thus, it is highly desirable to stop CMP processing at the desired endpoint.

One drawback of CMP processing is that it is difficult to determine when the substrate surface is both planar and at the desired endpoint elevation in the substrate assembly. In one conventional method for determining the endpoint of CMP processing, the planarizing period of one substrate assembly in a run is estimated using the polishing rate of previous substrate assemblies in the run and the thickness of material that is to be removed from the particular substrate assembly. The estimated planarizing period for the particular substrate assembly, however, may not be accurate because the polishing rate may change from one substrate assembly to another. Thus, this method may not accurately planarize all of the substrate assemblies in a run to the desired endpoint.

In another method for determining the endpoint of CMP processing, the substrate assembly is removed from the pad and the substrate carrier, and then a measuring device measures a change in thickness of the substrate assembly. Removing the substrate assembly from the pad and substrate carrier, however, is time-consuming and may damage the substrate assembly. Thus, this method generally reduces the throughput and yield of CMP processing.

In still another method for determining the endpoint of CMP processing, a portion of the substrate assembly is moved beyond the edge of the pad, and an interferometer directs a beam of light directly onto the exposed portion of the substrate assembly to measure a change in thickness of a transparent layer. The substrate assembly, however, may not be in the same reference position each time it overhangs the pad. For example, because the edge of the pad is compressible, the substrate assembly may not be at the same elevation for each measurement. Thus, this method may inaccurately measure the change in thickness of the substrate assembly.

In yet another method for determining the endpoint of CMP processing, U.S. Pat. Nos. 5,036,015 and 5,069,002, which are herein incorporated by reference, disclose detecting the planar endpoint by sensing a change in friction between a wafer and the polishing medium. Such a change of friction may be produced by a different coefficient of friction at the wafer surface as one material (e.g., an oxide) is removed from the wafer to expose another material (e.g., a metal film). More specifically, U.S. Pat. Nos. 5,036,015 and 5,069,002 disclose detecting the change in friction by measuring the change in electrical current through the drive motor for the platen and/or substrate holder.

Although the endpoint detection technique disclosed in U.S. Pat. Nos. 5,036,015 and 5,069,002 is an improvement over the previous endpointing methods, the increase in current through the drive motors may not accurately indicate the endpoint of a substrate. The detection of a single change in friction at the interface between the different materials may only indicate that at least a portion of the substrate surface is at the level of the interface. Other portions of the substrate surface, however, may be above or below the interface level and/or the interface level itself may not be planar. The apparatus and methods disclosed in U.S. Pat. Nos. 5,036,015 and 5,069,002 may accordingly indicate that at least a portion of the substrate surface is at the endpoint elevation, but they do not necessarily indicate that the substrate surface is planar. Thus, the apparatus and methods of U.S. Pat. Nos. 5,036,015 and 5,069,002 may not indicate that the substrate surface is both planar and at the endpoint elevation.

SUMMARY OF THE INVENTION

The present invention relates to mechanical and chemical-mechanical planarizing processes for manufacturing microelectronic-device substrate assemblies. One aspect of the invention is directed toward a method for planarizing a microelectronic-device substrate assembly by removing material from a surface of the substrate assembly, detecting a first change in drag force between the substrate assembly and a polishing pad indicating that the substrate surface is at least substantially planar, and identifying a second change in drag force between the substrate assembly and the polishing pad indicating that the planar substrate surface is at least substantially at the endpoint elevation. After the second change in drag force is identified, the planarization process is stopped.

The removal of material from the substrate surface generally involves pressing the substrate surface against a polishing pad and imparting relative motion between the substrate surface and the polishing pad. The first change in drag force between the substrate assembly and the polishing pad is preferably detected by measuring a first change in the electrical current through a drive motor driving a substrate holder carrying the substrate assembly and/or a table carrying the polishing pad. The first change in drag force may alternatively be detected by measuring a first change in temperature of the planarizing solution or the polishing pad. The second change in drag force between the substrate assembly and the polishing pad may be identified by detecting a second change in the drive motor current, or measuring a second in the temperature of the planarizing solution or the polishing pad. The first change in drag force indicates that the substrate surface is at least substantially planar, and the second change in drag force indicates that the planar substrate surface is at least substantially at the endpoint elevation. After the second change in drag force between the substrate assembly and the polishing pad is identified, the act of stopping removal of material from the substrate surface generally involves removing the substrate assembly from the polishing pad and/or terminating the relative motion between the substrate assembly and the polishing pad.

In one particular aspect of the invention, the second change in drag force between the substrate assembly and the planarizing medium is accentuated from the drag force when the substrate surface is planar by constructing a substrate assembly including an endpoint indicator having a first coefficient of friction at an endpoint elevation and a cover layer having a second coefficient of friction over the endpoint indicator. For example, the endpoint indicator is preferably fabricated by plasma deposition of a silicon nitride layer at the endpoint elevation, and the cover layer is preferably formed by depositing a high density plasma oxide layer over the plasma silicon nitride layer. Alternatively, the endpoint indicator can be fabricated by depositing either a silicon carbide layer or a boron nitride layer at the endpoint elevation.

In each of these more particular aspects of the invention, the first change in drag force can be detected by measuring an increase in the electrical current through the drive motor of the table from a start current to a planarity current indicating that the substrate surface is planar and located in the high density plasma oxide layer. Additionally, the second change in drag force can be identified by measuring a decrease in the electrical current through the drive motor from the planarity current to an endpoint current because each of the plasma silicon nitride, boron nitride and silicon carbide endpoint indicators has a significantly lower coefficient of friction than the high density plasma oxide layer. Accordingly, many aspects of the invention involve first detecting that a planar surface has been formed on the substrate assembly by detecting a first change in the table current, and then identifying that the particular endpoint of the substrate assembly has been reached by subsequently identifying a second change in the table current. Other aspects of the invention also involve modifying the surface of the endpoint indicator to accentuate the difference in drag force between the substrate assembly and the polishing pad at the endpoint elevation.

DETAILED DESCRIPTION OF THE INVENTION

The present disclosure describes substrate assembly structures, apparatuses and methods for mechanical and/or chemical-mechanical planarization of microelectronic-device substrate assemblies. Many specific details of certain embodiments of the invention are set forth in the following description, and in FIGS. 2–9, to provide a thorough understanding of the embodiments described herein. One skilled in the art, however, will understand that the present invention may have additional embodiments, or that the invention may be practiced without several of the details described in the following description. For example, even though many aspects of the present invention are described below in the context of constructing shallow-trench-isolation (STI) structures, the invention is also applicable to constructing other structures and components in the manufacturing of microelectronic devices.

Figure 2:
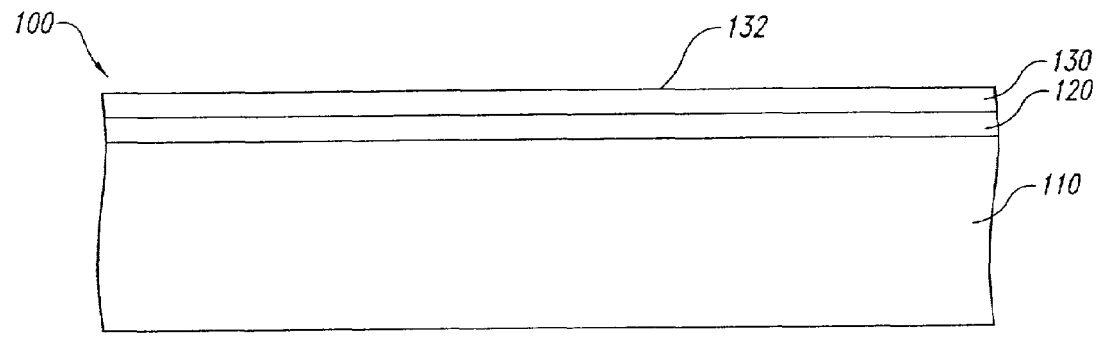
FIG. 2 is a partial schematic cross-sectional view of one stage in a method for constructing a shallow-trench-isolation structure on a microelectronic-device substrate assembly in accordance with one embodiment of the invention.

FIG. 2 is a partial schematic cross-sectional view of one stage in a method for constructing an STI structure on a microelectronic-device substrate assembly 100 in accordance with one embodiment of the invention. The substrate assembly 100 has a substrate 110, a thin oxide layer 120 formed over the substrate 110, and an elevation indicator or endpoint indicator 130 formed over the oxide layer 120. In the fabrication of STI structures and other components for integrated circuits in semiconductor devices, the substrate 110 is preferably a single crystal silicon wafer. The substrate 110 can alternatively be a glass substrate for a baseplate of a field emission display, or any other suitable type of substrate for other types of microelectronic devices. When the substrate 110 is composed of silicon, the oxide layer 120 is preferably a thin layer of silicon dioxide grown by oxidizing the surface of the substrate 110. The oxide layer 120, for example, generally has a thickness of approximately 100 Å to define a pad oxide layer.

The endpoint indicator 130 is fabricated on the oxide layer 120 so that a top surface 132 of the endpoint indicator 130 is located at a desired endpoint elevation for subsequent CMP processing of the substrate assembly 100. The endpoint indicator 130 is composed of a material that has a first coefficient of friction, such as a material having either a very high or a very low coefficient of friction. For example, low frictional coefficient endpoint indicators can be composed of silicon carbide, boron nitride, or plasma deposited silicon nitride. Suitable deposition techniques for the plasma deposited silicon nitride include plasma vapor deposition techniques that are known in the semiconductor device fabrication arts. After the endpoint indicator 130 has been formed, the trenches for the STI structures are formed.

Figure 3:
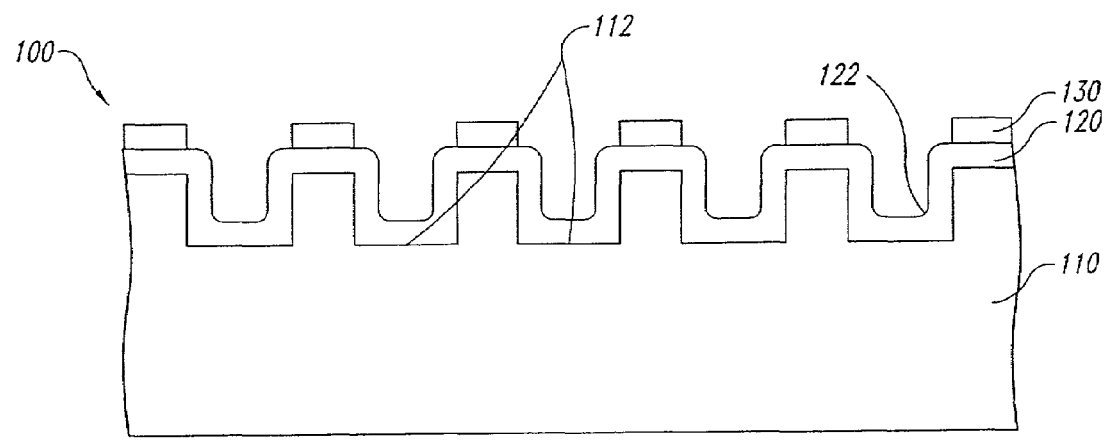
FIG. 3 is a partial schematic cross-sectional view of a subsequent stage of the method for constructing shallow-trench-isolation structures shown in FIG. 2.
Figure 4:
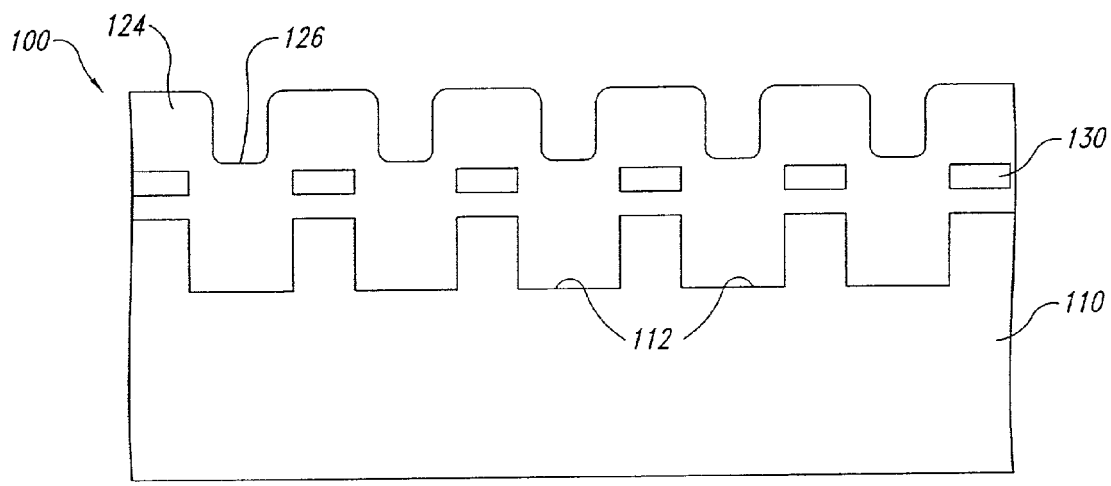
FIG. 4 is a partial schematic cross-sectional view of a subsequent stage of the method for constructing shallow-trench-isolation structures shown in FIGS. 2 and 3.

FIGS. 3 and 4 are partial schematic cross-sectional views of subsequent stages of the method for constructing an STI structure on the substrate assembly 100. FIG. 3 illustrates the substrate assembly 100 after a plurality of trenches 112 have been etched in the substrate 10 and an oxide liner 122 has been grown in each of the trenches 112. The trenches 112 are formed by photopatterning a layer of resist (not shown) on the endpoint indicator 130, and then etching through the endpoint indicator 130, the oxide layer 120, and a portion of the substrate 10. The oxide liner 122 is then formed by oxidizing the exposed silicon in the trenches 112 to grow a thin layer of silicon dioxide in the trenches that connects with the silicon dioxide of the oxide layer 120. Isolated pads of the endpoint indicator 130 are then left on the oxide layer 120 between the trenches 112.

Referring to FIG. 4, the material for the STI structures is provided by depositing a cover layer 124 over the endpoint indicator 130 and into the trenches 112. The cover layer 124 has a second coefficient of friction that is different from the first coefficient of friction of the endpoint indicators 130. For example, when the cover has a relatively high coefficient of friction, the endpoint indicator 130 is selected from a material having a low coefficient of friction. Alternatively, the top surfaces 132 of the endpoint indicator 130 can be treated to impart a high or low coefficient of friction to the endpoint indicator 130. The cover layer 124 is preferably formed by depositing silicon dioxide using a high density plasma process. The high density plasma (HDP) silicon dioxide combines with the silicon dioxide liner 122 (FIG. 3) and the oxide layer 120 to form an integral cover layer 124 of silicon dioxide. The HDP silicon dioxide has a higher coefficient of friction than boron nitride, silicon carbide, or plasma deposited silicon nitride used as the endpoint indicator 130. At this point of fabricating the STI structures, the substrate assembly 100 is now ready to be planarized to remove excess material of the cover layer 124 from the substrate assembly 100.

Figure 1:
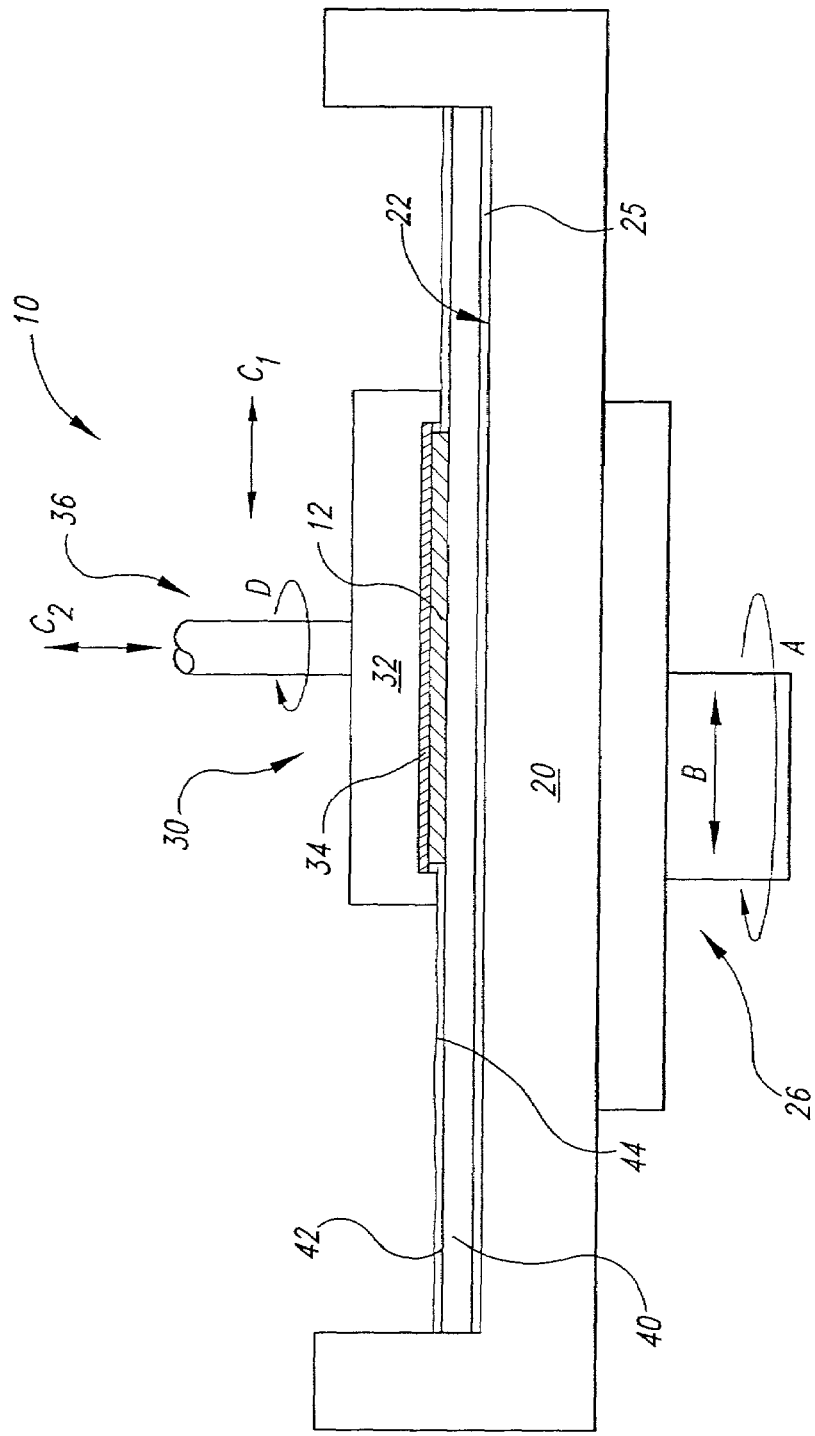
FIG. 1 is a schematic cross-sectional view partially illustrating a planarizing machine in accordance with the prior art.
Figure 5A:
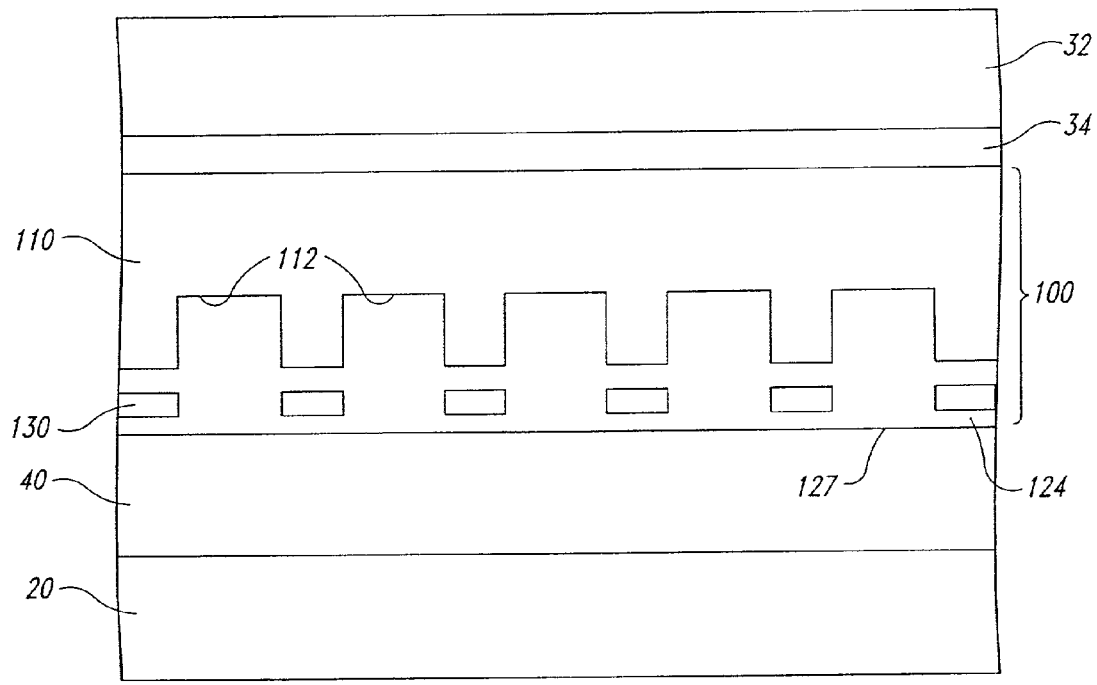
FIG. 5A is a partial schematic cross-sectional view of another subsequent stage of the method for constructing shallow-trench-isolation structures shown in FIGS. 2–4.
Figure 5B:
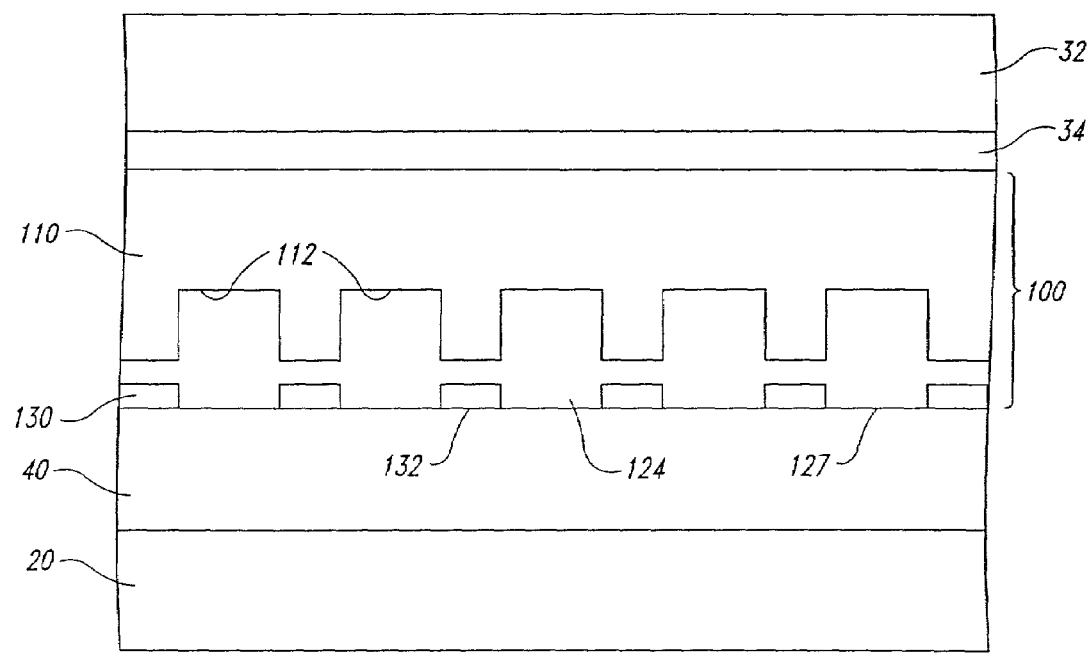
FIG. 5B is a partial schematic cross-sectional view of another subsequent stage of the method for constructing shallow-trench-isolation structures shown in of FIGS. 2–5A.

FIGS. 5A and 5B are partial schematic cross-sectional views illustrating subsequent stages of the method for constructing an STI structure involving mechanical and/or chemical-mechanical planarization of the substrate assembly 100. Referring to FIG. 5A, the substrate assembly 100 is inverted and attached to a backing pad 34 in a substrate holder 32 so that the substrate assembly 100 is positioned over a polishing pad 40 on a table 20. The table 20, substrate holder 32, backing pad 34, and polishing pad 40 can be similar to those described above with respect to FIG. 1. The substrate holder 32 then presses the cover layer 124 against the polishing pad 40, and the substrate holder 32 and/or the polishing pad 40 move to translate the substrate assembly 100 across the polishing pad 40 in the presence of a planarizing solution (not shown). After a period of time, a planar substrate surface 127 is formed at an intermediate elevation in the cover layer 124. The substrate surface 127, more particularly, becomes planar at an elevation spaced apart from the top surfaces 132 of the endpoint indicators 130.

Referring to FIG. 5B, the substrate assembly 100 is further planarized until the substrate surface 127 of the cover layer 124 is coplanar with exposed top surfaces 132 of the endpoint indicators 130. At this point of the planarizing stage, it is important to accurately stop removing material from both the endpoint indicators 130 and the cover layer 124 to prevent over-polishing or under-polishing of the substrate assembly 100.

Figure 5C:
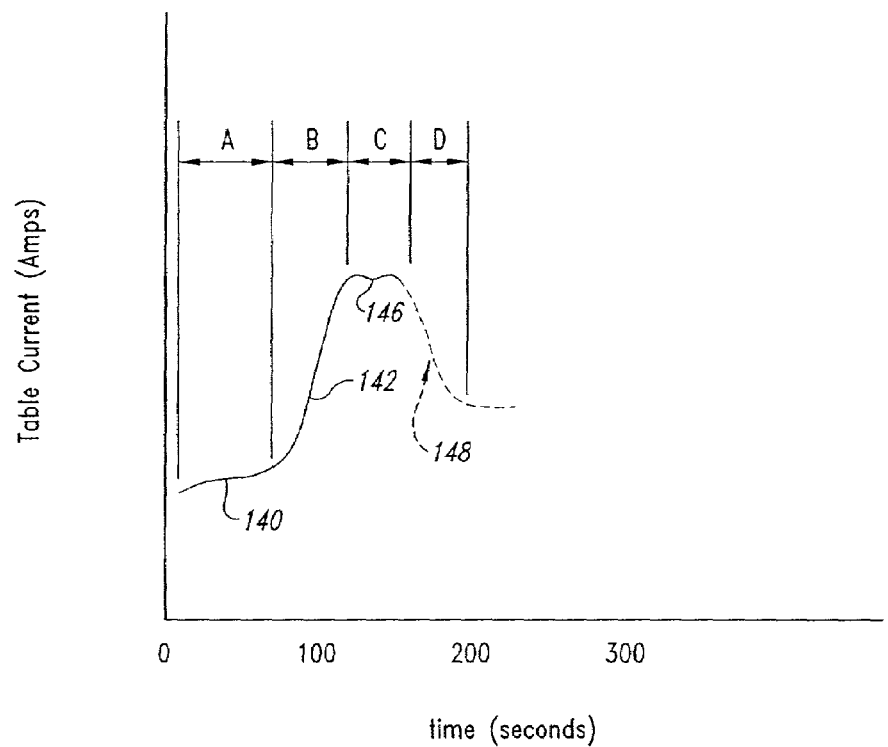
FIG. 5C is a diagram illustrating an embodiment of a method for endpointing planarization of a microelectronic-device substrate assembly by detecting a first change in drag force between the substrate assembly and the polishing pad, and then identifying a second change in drag force between the substrate assembly and the polishing pad.

FIG. 5C illustrates one embodiment for accurately endpointing the planarizing stage of the method for forming STI structures. The endpoint is determined by detecting a first change in drag force between the substrate assembly and the polishing pad indicating that the substrate surface 127 has become planar (FIG. 5A), and then identifying a second change in drag force caused by exposing the endpoint indicators 130 indicating that the planar substrate surface 127 is at the endpoint elevation (FIG. 5B). FIG. 5C, more particularly, illustrates an embodiment of the method in which: (1) the first and second changes in drag force are indicated by measuring a change in the electrical current through a drive motor driving the table 20 (FIG. 1) of the planarizing machine; and (2) the second coefficient of friction of the cover layer 124 is greater than the first coefficient of friction of the endpoint indicators 130. The resulting current trace exhibits a start up current 140, a first change in current 142 detecting the first change in drag force, a planarity current 146, and a second change in current 148 identifying a second change in drag force.

Still referring to FIG. 5C, the start up current 140 remains relatively constant during a first stage A of the CMP process because the cover layer 124 is highly topographical (FIG. 4) and the surface area of the substrate assembly 100 contacting the polishing pad 40 remains relatively constant. The first change in current 142 increases rapidly in a second stage B of the CMP process because, as the substrate surface 127 becomes planar (FIG. 5B), the increase in surface area of the substrate assembly 100 contacting the polishing pad significantly increases the drag force between the substrate assembly 100 and the pad. Once the substrate surface 127 becomes planar, the table current remains substantially constant at the planarity current 146 in a third stage C of the CMP process. The second change in current 148 then decreases rapidly during a fourth stage D of the CMP process as the top surfaces 132 of the endpoint indicators 132 are exposed because the lower coefficient of friction of the endpoint indicators 130 reduces the drag force between the substrate assembly 100 and the polishing pad 40. The planarizing process is terminated after the second change 148 in current occurs indicating that the top surfaces 132 of the endpoint indicators 130 are exposed across the face of the substrate assembly 110 (FIG. 5B).

Figure 6:
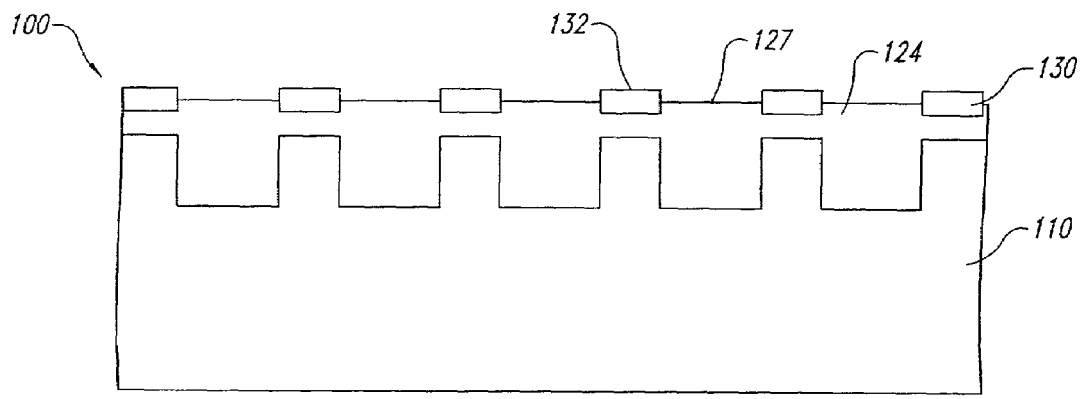
FIG. 6 is a partial schematic cross-sectional view of another subsequent stage of the method for constructing shallow-trench-isolation structures shown in FIGS. 2–5B.
Figure 7:
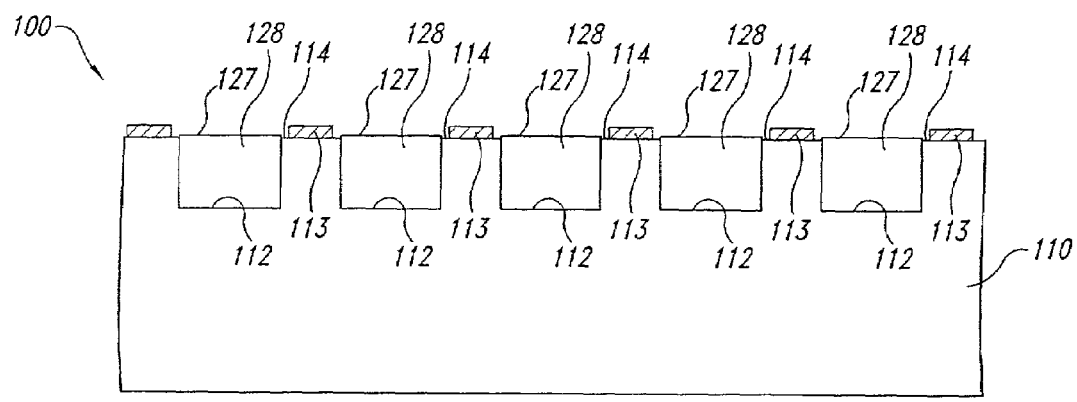
FIG. 7 is a partial schematic cross-sectional view of another subsequent stage of the method for constructing shallow-trench-isolation structures shown in FIGS. 2–6.

FIGS. 6 and 7 are partial schematic cross-sectional views illustrating subsequent processing of the substrate assembly 100 after the substrate assembly 100 has been planarized to form the STI structures. Referring to FIG. 6, the substrate assembly 100 is dipped in a buffered HF solution to remove a portion of the cover layer 124 between the endpoint indicators 130. The upper surfaces 127 of the cover layer 124 are accordingly slightly below the exposed surfaces 132 of the endpoint indicators 130.

FIG. 7 illustrates the substrate assembly 100 after the endpoint indicators 130 have been removed and the cover layer 124 (FIG. 6) has been uniformly etched to form a plurality of STI structures 128 between active areas 114 of the substrate 110. When the endpoint indicators 130 are formed from plasma silicon nitride, the endpoint indicators 130 are stripped from the substrate assembly 100 by dipping the substrate assembly 100 in a phosphoric acid dip. The cover layer 124 is then etched until the sections of the cover layer 124 that were previously under the endpoint indicators 130 (see FIG. 6) are removed to expose the active areas 114 of the substrate 110. The STI structures 128 filling the trenches 112 in the substrate 110 accordingly isolate active areas 114 of the substrate 110 from one another. As such, active features 113 can be constructed on the active areas 114 in accordance with known microelectronic-device fabrication processes. During the fabrication of such active features 113 and the associated contacts, the raised portions of the STI structures 128 are generally lowered to approximately the level of the substrate 110 (not shown).

The methods set forth above with respect to FIGS. 2–7 enhance the yield of operable STI structures because the process for endpointing the planarizing stage accurately indicates both the planarity and the endpoint elevation of the substrate surface. Conventional planarizing and endpointing methods often produce surfaces with variances from the desired endpoint elevation of approximately ±200 Å because they do not detect whether the substrate surface is planar. In contrast to conventional endpointing methods, by first detecting that the substrate surface is planar and then identifying that the substrate surface is at the endpoint elevation in accordance with the methods set forth above with respect to FIGS. 2–7, the deviation in uniformity across the surface of the substrate assembly is generally approximately ±10 Å. Several embodiment of the endpointing process of the invention are thus expected to reduce problems associated with over-polishing or under-polishing the substrate assembly that can create current leakage paths or even destroy the integrated circuit components on substrate assemblies.

Figure 8:
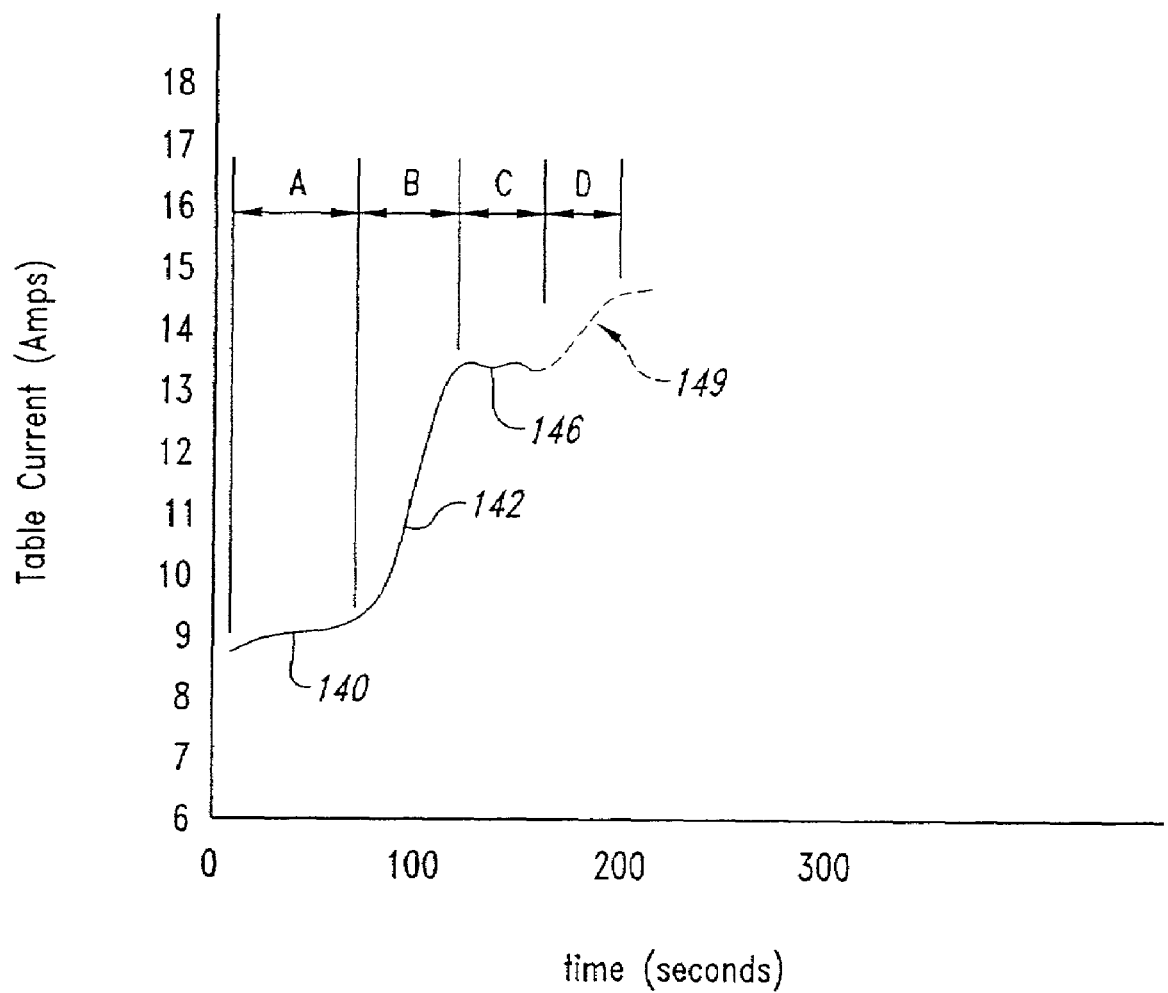
FIG. 8 is a diagram illustrating another embodiment for endpointing planarization of a microelectronic-device substrate assembly.

FIG. 8 is a diagram illustrating another embodiment of a process for endpointing the planarizing stage of processing a semiconductor assembly. In this embodiment, the start up current 140, the first change in current 142, and the planarity current 146 follow a trace similar to that described above with respect to FIG. 5C. The endpoint indicators 130 (FIGS. 2–5B) of this embodiment, however, have a higher coefficient of friction than the cover layer 124 (FIGS. 2–5B). Accordingly, the second change in current 149 increases from the planarity current 146 to an endpoint current at the end of the fourth stage D of the planarizing process. The difference in the coefficient of friction between the cover layer 124 and the endpoint indicators 130 can accordingly be selected such that the second change in drag force after the substrate surface 127 has become planar may accordingly increase or decrease with respect to the drag force when the substrate surface is planar.

In another embodiment (not shown), the slurry can be modified or selected to cause a decrease in drag force as the substrate surface 127 becomes planar such that the first change in drag force decreases during the second stage B (FIG. 5C) of the planarizing process. One suitable slurry for decreasing the drag force as the substrate surface 127 becomes planar is Klevesol, manufactured by Rodel Corporation. Thus, the first change in the table current may decrease from the start current.

In still another embodiment of the invention, the first and/or second coefficients of friction of the endpoint indicator 130 and/or the cover layer 124 can be modified to increase the difference between the first and second coefficients of friction. Referring to FIG. 5B, for example, a slurry (not shown) between the substrate assembly 100 and the polishing pad 40 can be modified or selected to react with the top surfaces 132 of the endpoint indicator 130 in a manner that either reduces or increases the first coefficient of friction of the top surfaces 132 of the endpoint indicator 130. One particular embodiment adds surfactants and/or other chemicals to a slurry to increase or decrease the first coefficient of friction of the surface stratum of an endpoint indicator 130. For example, a polyoxyethylene ether can be added to a slurry (e.g., Corrundum or ILD-1300 slurries manufactured by Rodel Corporation) to decrease the coefficient of friction at the surface of a silicon nitride endpoint indicator. This particular embodiment is accordingly particularly well suited for use with a cover layer composed of silicon dioxide because it increases the difference between the coefficients of friction between the reacted silicon nitride and the silicon dioxide.

In another embodiment, the top surfaces 132 of the endpoint indicator 130 can be modified using implantation, diffusion, deposition or other techniques to create a surface stratum of the endpoint indicator 130 having a desired coefficient of friction. Referring to FIGS. 2 and 3, for example, the surface of the endpoint indicator 130 can be treated to increase or decrease the difference in the coefficients of friction at the interface between the endpoint indicator 130 and the cover layer 124 (FIG. 4). One particular embodiment involves implanting boron, phosphor and/or carbon into a silicon nitride endpoint indicator to create a surface stratum having a lower coefficient of friction than the untreated silicon nitride. Another particular embodiment involves diffusing boron and/or phosphor into a polysilicon endpoint indicator to create a surface stratum having a different coefficient of friction than the polysilicon. Still another particular embodiment involves depositing a thin layer of silicon carbide or boron over a thermally deposited silicon nitride layer (e.g., Chemical Vapor Deposition) to produce a surface stratum having a lower coefficient of friction than the silicon nitride layer.

Figure 9:
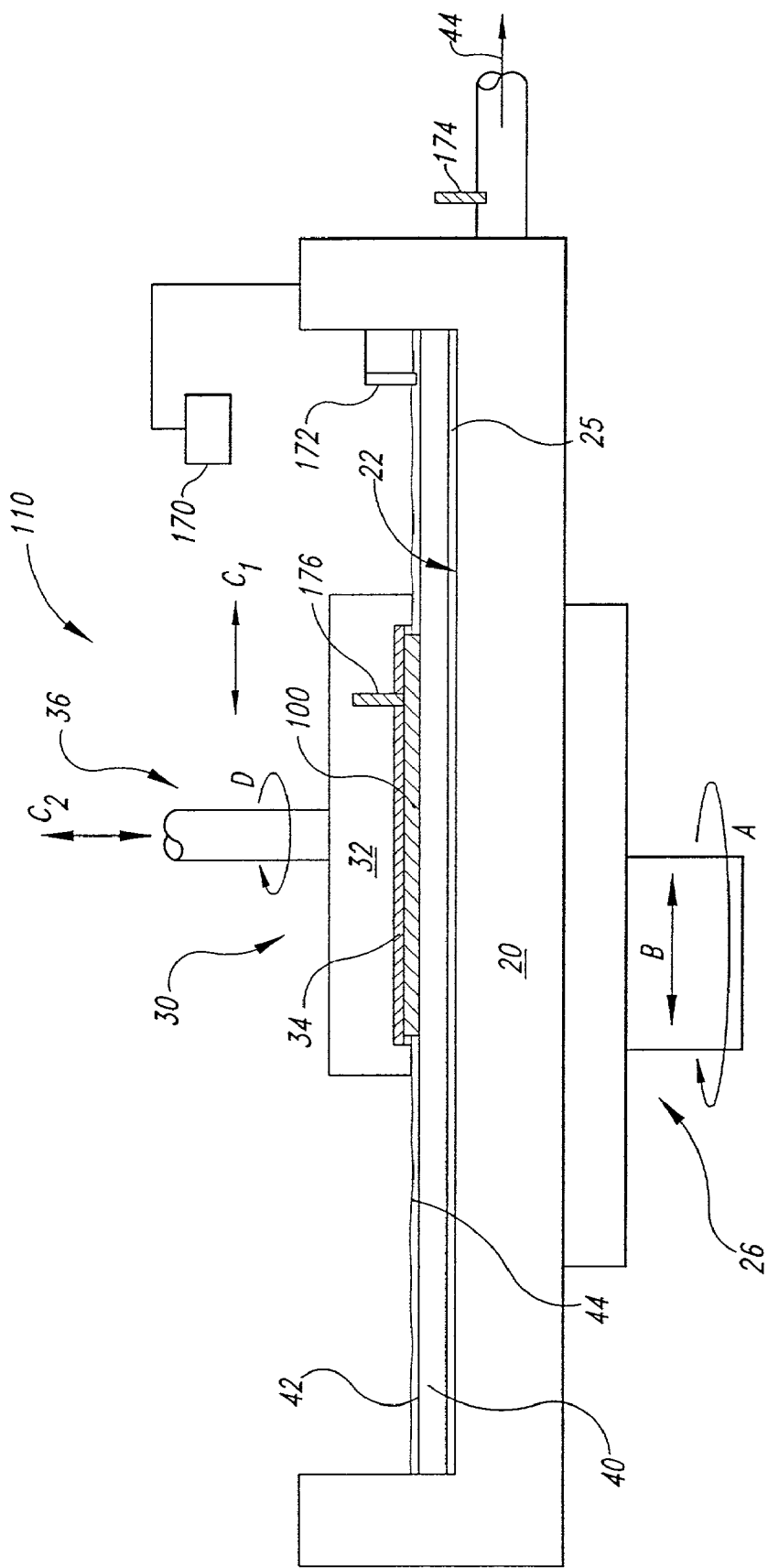
FIG. 9 is a schematic cross-sectional view of a planarizing machine in accordance with an embodiment of the invention.

FIG. 9 is a schematic cross-sectional view of a planarizing machine 110 in accordance with yet another embodiment of the invention in which the first and second changes in drag force can be monitored by measuring the temperature change of the slurry, the polishing pad and/or the substrate assembly. The planarizing machine 110, for example, can have an infrared sensor 170 positioned over the polishing pad to measure the temperature changes of either the polishing pad 40 or the planarizing solution 44 on the polishing pad 40. In alternative embodiments, the planarizing machine 110 can have a temperature sensor 172 touching the planarizing solution 44 on the pad 40, or a temperature sensor 174 located in a flow of planarizing solution 44 off of the polishing pad 40. In still another alternative embodiment, a temperature sensor 176 attached to the substrate holder 32 measures changes in the temperature of the substrate assembly 100. In these embodiments, an increase in temperature indicates a corresponding increase in drag force between the substrate assembly 100 and the polishing pad 40. Similarly, a decrease in temperature indicates a decrease in drag force. The changes in temperature are expected to follow traces similar to those shown in FIGS. 5C and 8, except that the axis labeled "Table Current" would represent the "Temperature."

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A planarizing system for removing material from a microelectronic-device substrate assembly, comprising:
    a table;
    a polishing pad attached to the table, the polishing pad having a planarizing surface;
    a carrier assembly including a substrate holder positionable over the polishing pad, the substrate holder being moveable along an axis at an angle with respect to the planarizing surface, and at least one of the substrate holder and the polishing pad being moveable in a plane to translate the substrate holder with respect to the planarizing surface of the polishing pad;
    a substrate assembly including a substrate, an endpoint indicator having a first coefficient of friction at an endpoint elevation over the substrate, and a cover layer having a second coefficient of friction over the endpoint indicator, the endpoint indicator further including a treated surface stratum at the endpoint elevation having a coefficient of friction that is different from the first coefficient of friction and the second coefficient of friction, the substrate assembly being attached to the substrate holder;
    a first thermal drag force indicator attached to the substrate holder, the first thermal drag force indicator operable to detect changes in temperature of the substrate assembly while the substrate assembly and the planarizing pad are moved relative to one another and thereby to measure changes in drag force between the substrate assembly and the polishing pad; and
    a second thermal drag force indicator positioned over and spaced apart from the polishing pad, the second thermal drag force indicator operable to detect changes in temperature of at least one of the planarizing pad and a planarizing solution on the planarizing surface while the substrate assembly and the planarizing pad are moved relative to one another and thereby to measure changes in drag force between the substrate assembly and the polishing pad.

2. The system of claim 1 wherein the second thermal drag force indicator comprises an infrared sensor.

3. The system of claim 1 wherein the first thermal drag force indicator comprises at least one temperature sensor contacting the substrate assembly.

4. A planarizing system for planarizing a microelectronic-device substrate assembly, comprising:
    a polishing pad supported on a table, the pad having a planarizing surface facing away from the table;
    a carrier assembly configured to retain the substrate assembly over the planarizing surface, at least one of the carrier assembly and the planarizing surface being moveable in a plane to translate the substrate assembly retained by the carrier with respect to the planarizing surface;
    a first thermal drag force indicator attached to the carrier assembly, the first thermal drag force indicator operable to detect changes in temperature of the substrate assembly while the substrate assembly and the planarizing pad are moved relative to one another and thereby to measure changes in drag force between the substrate assembly and the planarizing surface while the substrate assembly and the planarizing pad are moved relative to one another; and
    a second thermal drag force indicator positioned over and spaced apart from the planarizing pad, the second thermal drag force indicator operable to detect changes in temperature of at least one of the planarizing pad and a planarizing solution on the planarizing surface while the substrate assembly and the planarizing pad are moved relative to one another and thereby to measure changes in drag force between the substrate assembly and the polishing pad.

5. The system of claim 4 wherein the second thermal drag force indicator comprises an infrared sensor.

6. The system of claim 4 wherein the first thermal drag force indicator comprises at least one temperature sensor contacting the substrate assembly.

7. A system for detecting an endpoint in a microelectronic-device substrate assembly during a planarization process, comprising:
- a polishing pad supported on a table, the pad having a planarizing surface facing away from the table;
- a carrier assembly configured to retain the substrate assembly over the planarizing surface, at least one of the carrier assembly and the planarizing surface being moveable in a plane to translate the substrate assembly retained by the carrier with respect to the planarizing surface;
- a first thermal drag force indicator attached to the carrier assembly, the first thermal drag force indicator operable to detect changes in temperature of the substrate assembly while the substrate assembly and the planarizing pad are moved relative to one another and thereby to measure changes in drag force between the substrate assembly and the planarizing surface; and
- a second thermal drag force indicator positioned over and spaced apart from the polishing pad, the second thermal drag force indicator operable to detect changes in temperature of at least one of the planarizing pad and a planarizing solution on the planarizing surface while the substrate assembly and the planarizing pad are moved relative to one another and thereby to measure changes in drag force between the substrate assembly and the planarizing surface.

8. The system of claim 7 wherein the second thermal drag force indicator comprises an infrared sensor.

9. The system of claim 7 wherein the first thermal drag force indicator comprises at least one temperature sensor contacting the substrate assembly.

10. The system of claim 1, further comprising a third thermal drag force indicator positioned in a flow path of the planarizing solution flowing off of the planarizing surface.

11. The system of claim 4, further comprising a third thermal drag force indicator positioned in a flow path of the planarizing solution flowing off of the planarizing surface.

12. The system of claim 7, further comprising a third thermal drag force indicator positioned in a flow path of the planarizing solution flowing off of the planarizing surface.

13. The system of claim 1 wherein the second thermal drag force indicator is positioned to contact the planarizing solution on the planarizing surface during planarization of the substrate assembly.

14. The system of claim 4 wherein the second thermal drag force indicator is positioned to contact the planarizing solution on the planarizing surface during planarization of the substrate assembly.

15. The system of claim 7 wherein the second thermal drag force indicator is positioned to contact the planarizing solution on the planarizing surface during planarization of the substrate assembly.

* * * * *